(12) United States Patent
Kadoguchi et al.

(10) Patent No.: US 10,049,952 B2
(45) Date of Patent: Aug. 14, 2018

(54) METHOD OF FABRICATING A SEMICONDUCTOR MODULE WITH A INCLINED GROOVE FORMED IN RESIN SIDE SURFACE

(71) Applicant: TOYOTA JIDOSHA KABUSHIKI KAISHA, Toyota-shi, Aichi-ken (JP)

(72) Inventors: Takuya Kadoguchi, Toyota (JP); Takahiro Hirano, Seto (JP); Yuuji Hanaki, Nagoya (JP); Shigeru Hayashida, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/659,914

(22) Filed: Jul. 26, 2017

(65) Prior Publication Data

US 2018/0040542 A1    Feb. 8, 2018

(30) Foreign Application Priority Data

Aug. 5, 2016    (JP) ................................ 2016-154747

(51) Int. Cl.
*H01L 21/00* (2006.01)
*H01L 23/34* (2006.01)
(Continued)

(52) U.S. Cl.
CPC .... *H01L 23/3107* (2013.01); *H01L 21/31058* (2013.01); *H01L 21/56* (2013.01);
(Continued)

(58) Field of Classification Search
CPC ..... H01L 23/3107; H01L 21/56; H01L 23/04; H01L 23/49568; H01L 21/31058;
(Continued)

(56) References Cited

U.S. PATENT DOCUMENTS 8,058,736 B2 * 11/2011 Koike ................... H01L 21/565
257/276
8,643,172 B2 * 2/2014 Foong ................... H01L 21/565
257/713
(Continued)

FOREIGN PATENT DOCUMENTS

JP    2005-117009 A    4/2005
JP    4289384 B2       7/2009
(Continued)

*Primary Examiner* — Alonzo Chambliss
(74) *Attorney, Agent, or Firm* — Oliff PLC

(57) ABSTRACT

A manufacturing method of a semiconductor module includes: sealing an assembly with resin, the assembly including a semiconductor chip, a heat-dissipation plate on the semiconductor chip, and multiple terminals, such that the resin includes a first surface, a second surface located opposite to the first surface, and a side surface, a groove extends in the side surface from the first surface to the second surface, an inner surface of the groove includes a first tapered surface, and a second tapered surface provided between the first tapered surface and the first surface, the second tapered surface inclining toward the first surface at a greater inclination angle than an inclination angle of the first tapered surface; and cutting the first surface within an area located on a first surface side from a boundary between the first tapered surface and the second tapered surface such that the heat-dissipation plate exposes.

6 Claims, 11 Drawing Sheets

(51) Int. Cl.
| | |
|---|---|
| *H05K 7/20* | (2006.01) |
| *H01L 23/31* | (2006.01) |
| *H01L 23/495* | (2006.01) |
| *H01L 21/3105* | (2006.01) |
| *H01L 21/56* | (2006.01) |
| *H01L 25/07* | (2006.01) |
| *H01L 25/18* | (2006.01) |
| *H01L 25/11* | (2006.01) |
| *H01L 23/04* | (2006.01) |

(52) U.S. Cl.
CPC ............ *H01L 21/565* (2013.01); *H01L 23/04* (2013.01); *H01L 23/3121* (2013.01); *H01L 23/49562* (2013.01); *H01L 23/49568* (2013.01); *H01L 23/49575* (2013.01); *H01L 25/072* (2013.01); *H01L 25/115* (2013.01); *H01L 25/18* (2013.01)

(58) Field of Classification Search
CPC ........... H01L 23/3121; H01L 23/49562; H01L 23/49575; H01L 25/072; H01L 25/115; H01L 25/18
See application file for complete search history.

(56) References Cited

U.S. PATENT DOCUMENTS

| | | | |
|---|---|---|---|
| 8,772,923 B2 * | 7/2014 | Minamio | H01L 21/565 257/674 |
| 2005/0056927 A1 | 3/2005 | Teshima et al. | |
| 2012/0223444 A1 * | 9/2012 | Yamagishi | H01L 23/315 257/787 |
| 2013/0154084 A1 * | 6/2013 | Kadoguchi | H01L 23/3121 257/717 |

FOREIGN PATENT DOCUMENTS

| JP | 2014-154779 A | 8/2014 |
|---|---|---|
| JP | 2014-157927 A | 8/2014 |

* cited by examiner

RELATED ART

METHOD OF FABRICATING A SEMICONDUCTOR MODULE WITH A INCLINED GROOVE FORMED IN RESIN SIDE SURFACE

INCORPORATION BY REFERENCE

The disclosure of Japanese Patent Application No. 2016-154747 filed on Aug. 5, 2016 including the specification, drawings and abstract is incorporated herein by reference in its entirety.

BACKGROUND

1. Technical Field

The present disclosure relates to a manufacturing method of a semiconductor module and a semiconductor module.

2. Description of Related Art

A manufacturing method of a semiconductor module is disclosed in Japanese Patent Application Publication No. 2005-117009. In this manufacturing method, an assembly is assembled by connecting a semiconductor chip, heat-dissipation plates, and multiple terminals to each other. Subsequently, the assembly is resin-sealed. In a step after the resin-sealing, the entire heat-dissipation plates are covered with resin. Subsequently, a surface of the resin is cut so as to expose the heat-dissipation plates on the surface of the resin. By performing the cutting in this manner, it is possible to make the surfaces of the exposed heat-dissipation plates and a surface of the resin around the heat-dissipation plates a flat surface.

A semiconductor module is disclosed in Japanese Patent Application Publication No. 2014-154779. This semiconductor module includes: an assembly formed by connecting semiconductor chips, heat-dissipation plates, and multiple terminals to each other; and resin with which the assembly is sealed. The multiple terminals project from side surfaces of the resin. The side surface of the resin is formed with grooves (recesses) extending from a top surface to a back surface of the resin. By providing these grooves in this manner, it is possible to set a surface distance between the terminals located on both sides of each groove (distance in a path extending along a surface of the resin) to be long, to thereby suppress a surface-discharge between these terminals.

SUMMARY

The cutting technique of JP 2005-117009 A can be used in a manufacturing process of the semiconductor module of JP 2014-154779 A. In this case, each groove in the side surface of the resin reaches a surface to be cut (hereinafter, referred to as a first surface). At the time of cutting the first surface near the groove, the resin is likely to be chipped at an edge of the groove (a corner at a boundary between an inner surface of the groove and the first surface).

A first aspect of the present disclosure provides a manufacturing method of a semiconductor module. The manufacturing method includes: sealing an assembly with resin, the assembly including a semiconductor chip, a heat-dissipation plate connected to the semiconductor chip, and multiple terminals connected to the semiconductor chip, such that the resin after the assembly is sealed includes a first surface, a second surface located opposite to the first surface, and a side surface connecting the first surface to the second surface, the multiple terminals projects from the side surface, a groove is provided between the multiple terminals in the side surface in a manner as to extend from the first surface to the second surface, an inner surface of the groove includes a first tapered surface inclining toward the first surface, and a second tapered surface provided between the first tapered surface and the first surface, the second tapered surface inclining toward the first surface at a greater inclination angle than an inclination angle of the first tapered surface; and cutting the first surface within an area located on a first surface side from a boundary between the first tapered surface and the second tapered surface such that the heat-dissipation plate exposes on the first surface.

The above "inclining toward the first surface" and the "inclination angle" will be explained with reference to FIG. 16. In FIG. 16, a part having oblique lines represents a resin 110, and a part having no oblique lines represents a space 120 around the resin 110. A direction Y in FIG. 16 denotes a thickness direction of the resin 110 (a direction from a second surface (not illustrated) toward a first surface 100), and the first surface 100 side is indicated to be positive. In FIG. 16, a direction X denotes a direction orthogonal to the direction Y and also intersecting a targeted tapered surface (101 or 102), and a direction going from the space 120 above the tapered surface toward the resin 110 is indicated to be positive. "Inclining toward the first surface" denotes inclining toward the positive side of the direction X as it goes toward the positive side of the direction Y, like the tapered surface 101 or 102 in FIG. 16. The "inclination angle" denotes an angle of each tapered surface relative to the direction Y. In FIG. 16, the inclination angle of the tapered surface 101 is an angle $\theta 1$, and the inclination angle of the tapered surface 102 is an angle $\theta 2$.

The above "multiple terminals" may be connected to the semiconductor chip via the heat-dissipation plate, or may be connected to the semiconductor chip via members other than the heat-dissipation plate (such as bonding wires and solder). Some of the multiple terminals may be connected to the semiconductor chip via the heat-dissipation plate, and the other terminals may be connected to the semiconductor chip via members other than the heat-dissipation plate. Some or all of the multiple terminals may be directly connected to the semiconductor chip.

In this manufacturing method, during the cutting, the first surface is cut within an area on the first surface side from the boundary between the first tapered surface and the second tapered surface. Hence, when the first surface is cut within an area including the groove, the first tapered surface is not cut while the second tapered surface is cut. Since the second tapered surface has a greater inclination angle, chipping in the resin is hard to occur near the groove during the cutting. Therefore, according to this method, it is possible to enhance production efficiency of the semiconductor module. In addition, it is also possible to suppress chipping of the resin during the cutting by forming the entire inner surface of the groove into a tapered surface with a greater inclination angle. However, in this case, a part of the groove has an extremely shallow depth, so that a surface distance between the terminals on the both sides of the groove becomes shorter. On the other hand, by configuring the inner surface of each groove by multiple tapered surfaces having different inclination angles, it is possible to set the entire depth of the groove to be sufficiently deep. Accordingly, it is possible to set the surface distance between the terminals on the both sides of the groove to be longer so as to enhance electric insulation between these terminals. As aforementioned, according to this method, it is possible to enhance the production efficiency of the semiconductor module having an excellent electric insulation between the terminals on the both sides of each groove.

A second aspect of the present disclosure provides a semiconductor module including: an assembly including a semiconductor chip, a heat-dissipation plate disposed on a surface of the semiconductor chip, and multiple terminals connected to the semiconductor chip, and resin provided such that the resign seals the assembly, the resin including a first surface in contact with the heat-dissipation plate, a second surface located opposite to the first surface, and side surfaces connecting the first surface to the second surface. The multiple terminals project from the side surface. A groove is provided between the multiple terminals in the side surface such that the groove extends from the first surface to the second surface. An inner surface of the groove includes a first tapered surface inclining toward the first surface, and a second tapered surface provided between the first tapered surface and the first surface, the second tapered surface inclining toward the first surface at a greater inclination angle than an inclination angle of the first tapered surface. The resin has an opening at which the heat-dissipation plate exposes on the first surface. The opening is provided from an area located on a first surface side from a boundary between the first tapered surface and the second tapered surface across the first surface.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
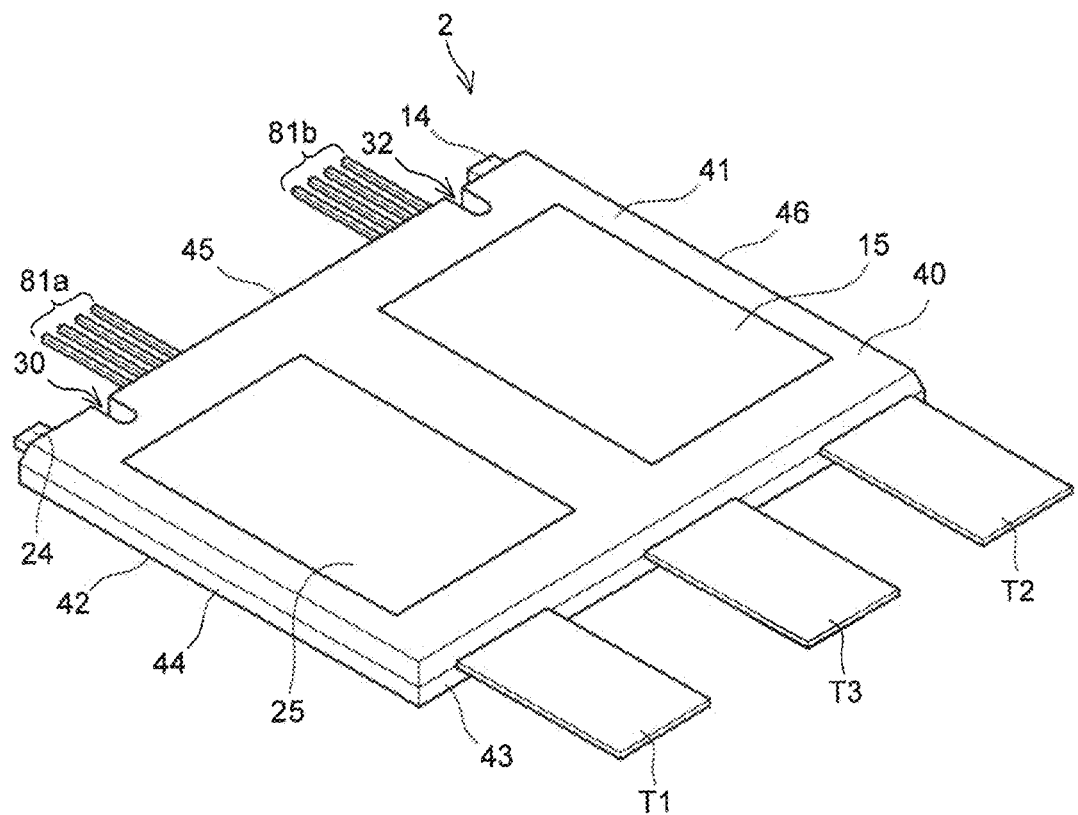
FIG. 1 is a perspective view of a semiconductor module.
Figure 2:
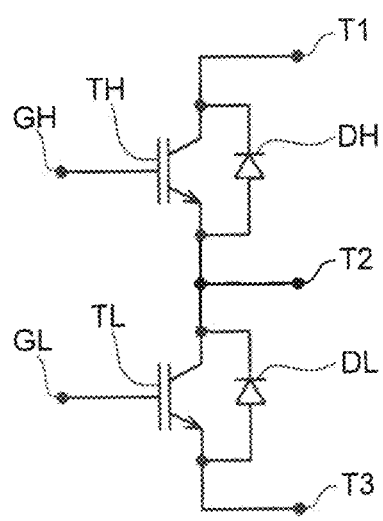
FIG. 2 is a circuit diagram of the semiconductor module.

FIG. 1 shows a perspective view of a semiconductor module 2 of an embodiment. The semiconductor module 2 is a device provided with four semiconductor chips inside a package resin 40. A circuit diagram of the inside of the semiconductor module 2 is shown in FIG. 2. The semiconductor module 2 has a circuit configured by two transistors TH, TL, and two diodes DH, DL. Each of the two transistors TH, TL and the two diodes DH, DL is configured by a semiconductor chip. An allowable current of each of the transistors TH, TL and the diodes DH, DL is 100 ampere or more, and they are elements mostly used in electric power conversion. The semiconductor module 2 is typically used in an inverter to supply electric power to a motor for travel in an electric vehicle, a hybrid vehicle, a fuel cell vehicle, or the like.

The two transistors TH, TL are connected to each other in series. The diode DH is connected in reversely parallel to the transistor TH, and the diode DL is connected in reversely parallel to the transistor TL. Hereinafter, a terminal on the plus side of the transistor TH is referred to as a terminal T1, a terminal on the minus side of the transistor TH (i.e., the plus side of the transistor TL) is referred to as a terminal T2, and a terminal on the minus side of the transistor TL is referred to as a terminal T3. As shown in FIG. 1, the terminals T1, T2, T3 project from a side surface 43 of the package resin 40. As shown in FIG. 2, the transistor TH includes a gate terminal GH, and the transistor TL includes a gate terminal GL. As shown in FIG. 1, multiple signal terminals 81a, 81b project from a side surface 45 of the package resin 40. The gate terminal GH is one of the multiple signal terminals 81a, and the gate terminal GL is one of the multiple signal terminals 81b. The other signal terminals 81a, 81b are signal terminals to monitor a state of the semiconductor chips. Terminals 14, 24 project from the side surface 45 of the package resin 40. The terminal 14 has an equal potential to that of the terminal T2, and the terminal 24 has an equal potential to that of the terminal T1.

Figure 3:
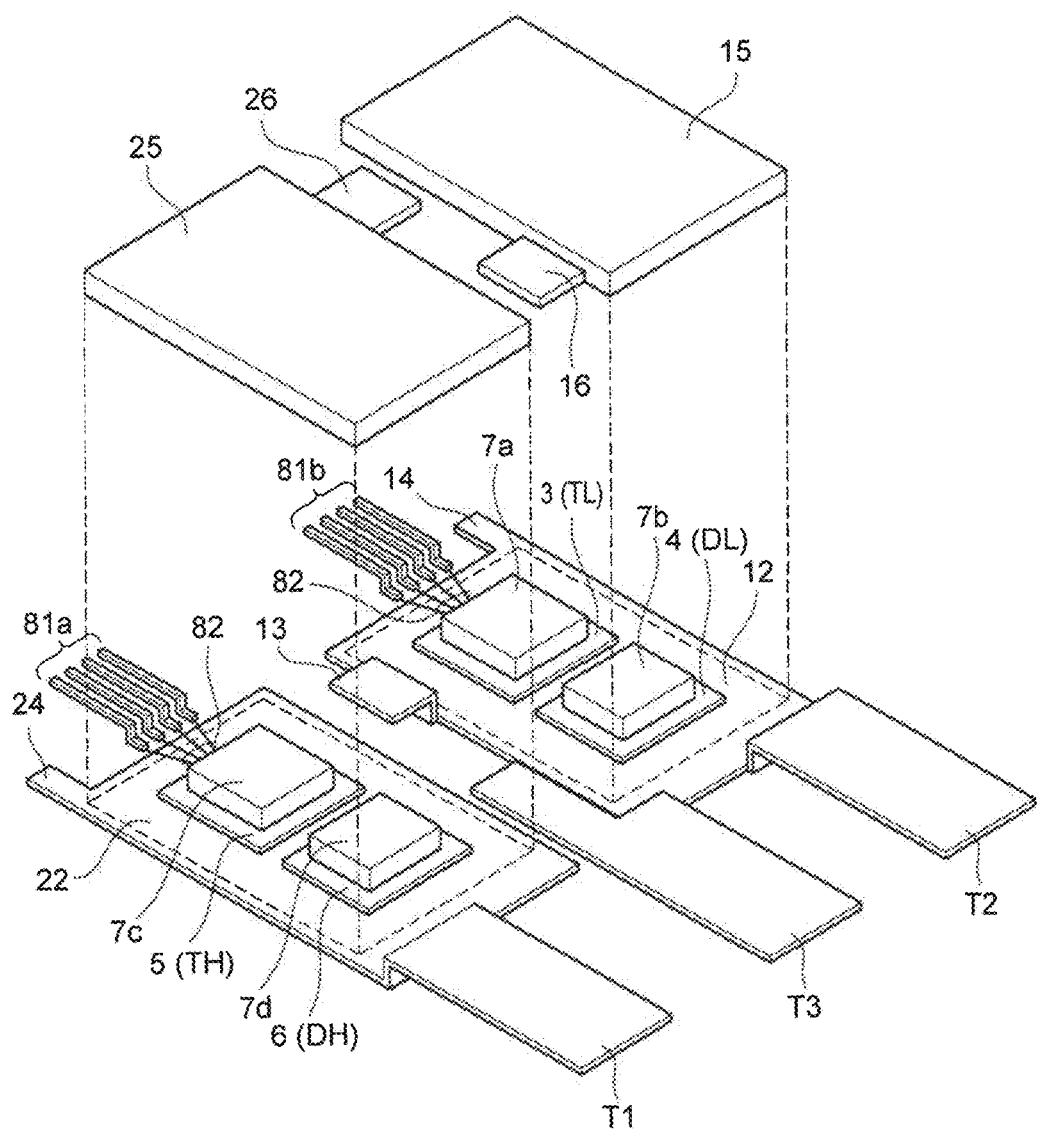
FIG. 3 is an exploded perspective view of the semiconductor module with an illustration of a package resin omitted.
Figure 4:
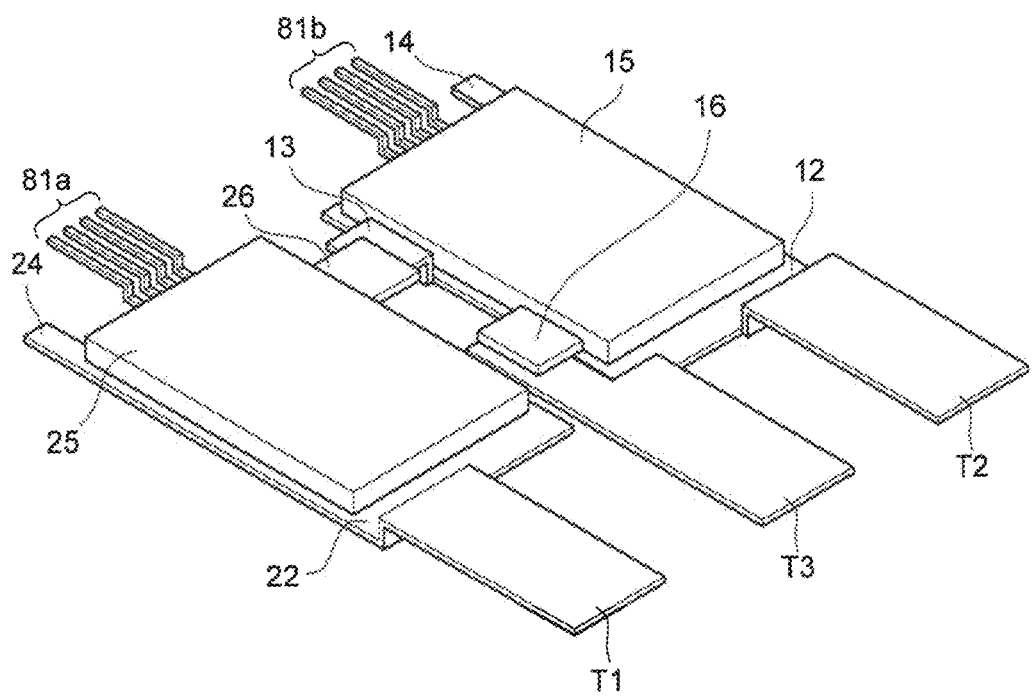
FIG. 4 is a perspective view of the semiconductor module with the illustration of the package resin omitted.

FIG. 3 is an exploded perspective view of the semiconductor module 2 while an illustration of the package resin 40 is omitted. FIG. 4 is a perspective view of the semiconductor module 2 while the illustration of the package resin 40 is omitted. As shown in FIG. 3, two heat-dissipation plates 12, 22 are disposed at a lowest position of the semiconductor module 2. The terminal T2 extends from one edge of the heat-dissipation plate 12. A joint portion 13 extends from another edge of the heat-dissipation plate 12. The terminal 14 extends from further another edge of the heat-dissipation plate 12. The heat-dissipation plate 12, the terminal T2, the joint portion 13, and the terminal 14 are continued. The terminal T1 extends from one edge of the heat-dissipation plate 22. The terminal 24 extends another edge of the heat-dissipation plate 22. The heat-dissipation plate 22, the terminal T1, and the terminal 24 are continued. The terminals 14, 24 are necessary terminals in the manufacturing process of the semiconductor module 2, and the terminals 14, 24 are not used while the semiconductor module 2 is in a usage state. The terminal T3 is disposed between the terminal T1 and the terminal T2. The terminal T3 is composed by a metallic plate that is a different body from the heat-dissipation plates 12, 22.

A semiconductor chip 3 composing the transistor TL is disposed on an upper surface of the heat-dissipation plate 12.

Although not illustrated, a collector electrode is provided on a lower surface of the semiconductor chip 3, and an emitter electrode is provided on an upper surface of the semiconductor chip 3. The collector electrode of the semiconductor chip 3 is joined onto the upper surface of the heat-dissipation plate 12. A metallic block 7a is disposed on the semiconductor chip 3. The metallic block 7a is joined to the emitter electrode on the upper surface of the semiconductor chip 3. Although not illustrated, a gate electrode and other signal electrodes are disposed on the upper surface of the semiconductor chip 3. One ends of bonding wires 82 are joined to the gate electrode and the other signal electrodes. The other ends of the bonding wires 82 are joined to the signal terminals 81b.

A semiconductor chip 4 composing the diode DL is joined onto the upper surface of the heat-dissipation plate 12. Although not illustrated, a cathode electrode is provided onto a lower surface of the semiconductor chip 4, and an anode electrode is provided onto an upper surface of the semiconductor chip 4. The cathode electrode of the semiconductor chip 4 is joined onto the upper surface of the heat-dissipation plate 12. A metallic block 7b is disposed on the semiconductor chip 4. The metallic block 7b is joined to the anode electrode on the upper surface of the semiconductor chip 4.

A heat-dissipation plate 15 is disposed on the metallic blocks 7a, 7b. A lower surface of the heat-dissipation plate 15 is joined to an upper surface of the metallic block 7a and an upper surface of the metallic block 7b. A joint portion 16 extends from an edge of the heat-dissipation plate 15. As shown in FIG. 4, the joint portion 16 is joined to the terminal T3.

A semiconductor chip 5 composing the transistor TH is disposed on an upper surface of the heat-dissipation plate 22. Although not illustrated, a collector electrode is provided on a lower surface of the semiconductor chip 5, and an emitter electrode is provided on an upper surface of the semiconductor chip 5. The collector electrode of the semiconductor chip 5 is joined onto the upper surface of the heat-dissipation plate 22. A metallic block 7c is disposed on the semiconductor chip 5. The metallic block 7c is joined to the emitter electrode on the upper surface of the semiconductor chip 5. Although not illustrated, a gate electrode and other signal electrodes are disposed on the upper surface of the semiconductor chip 5. One ends of bonding wires 82 are joined to the gate electrode and the other signal electrodes. The other ends of the bonding wires 82 are joined to signal terminals 81a.

A semiconductor chip 6 composing the diode DH is joined onto the upper surface of the heat-dissipation plate 22. Although not illustrated, a cathode electrode is provided onto a lower surface of the semiconductor chip 6, and an anode electrode is provided onto an upper surface of the semiconductor chip 6. The cathode electrode of the semiconductor chip 6 is joined onto the upper surface of the heat-dissipation plate 22. A metallic block 7d is disposed on the semiconductor chip 6. The metallic block 7d is joined to the anode electrode on the upper surface of the semiconductor chip 6.

As shown in FIGS. 3, 4, a heat-dissipation plate 25 is disposed on the metallic blocks 7c, 7d. A lower surface of the heat-dissipation plate 25 is joined to an upper surface of the metallic block 7c and an upper surface of the metallic block 7d. A joint portion 26 extends from an edge of the heat-dissipation plate 25. As shown in FIG. 4, the joint portion 26 is joined to the joint portion 13.

A circuit shown in FIG. 2 is configured by connecting these respective components in the above described manner.

As shown in FIG. 1, the package resin 40 covers peripheries of the semiconductor chips 3, 4, 5, 6, the metallic blocks 7a, 7b, 7c, 7d, and the heat-dissipation plates 12, 15, 22, 25. The package resin 40 covers respective base portions of the signal terminals 81a, 81b, the terminals T1, T2, T3, and the terminals 14, 24. The package resin 40 has an upper surface 41, a lower surface 42, and side surfaces 43 to 46. An upper surface of the heat-dissipation plate 15 and an upper surface of the heat-dissipation plate 25 are exposed on the upper surface 41 of the package resin 40. A flat surface is composed by the upper surface of the heat-dissipation plate 15, the upper surface of the heat-dissipation plate 25, and the upper surface 41 of the package resin 40. The lower surface 42 of the package resin 40 is located on an opposite side to the upper surface 41. Although not illustrated, a lower surface of the heat-dissipation plate 12 and a lower surface of the heat-dissipation plate 22 are exposed on the lower surface 42. The side surfaces 43 to 46 connect the upper surface 41 to the lower surface 42. The terminals T1, T2, T3 project from the side surface 43. The signal terminals 81a, 81b, and the terminals 14, 24 project from the side surface 45 opposite to the side surface 43.

The side surface 45 is provided with two grooves 30, 32. The grooves 30, 32 extend from the upper surface 41 to the lower surface 42. The groove 30 is disposed between the signal terminals 81a and the terminal 24. The groove 30 secures a surface distance between the signal terminals 81a and the terminal 24. Hence, even if a high potential difference occurs between the signal terminals 81a and the terminal 24, a surface discharge is hard to occur between the signal terminals 81a and the terminal 24. The groove 32 is disposed between the signal terminals 81b and the terminal 14. The groove 32 secures a surface distance between the signal terminals 81b and the terminal 14. Hence, even if a high potential difference occurs between the signal terminals 81b and the terminal 14, a surface discharge is hard to occur between the signal terminals 81b and the terminal 14. The grooves 30, 32 have substantially the same shape, and have substantially the same function. Therefore, the groove 32 will be described in detail, and description of the groove 30 will be omitted, hereinafter.

Figure 5:
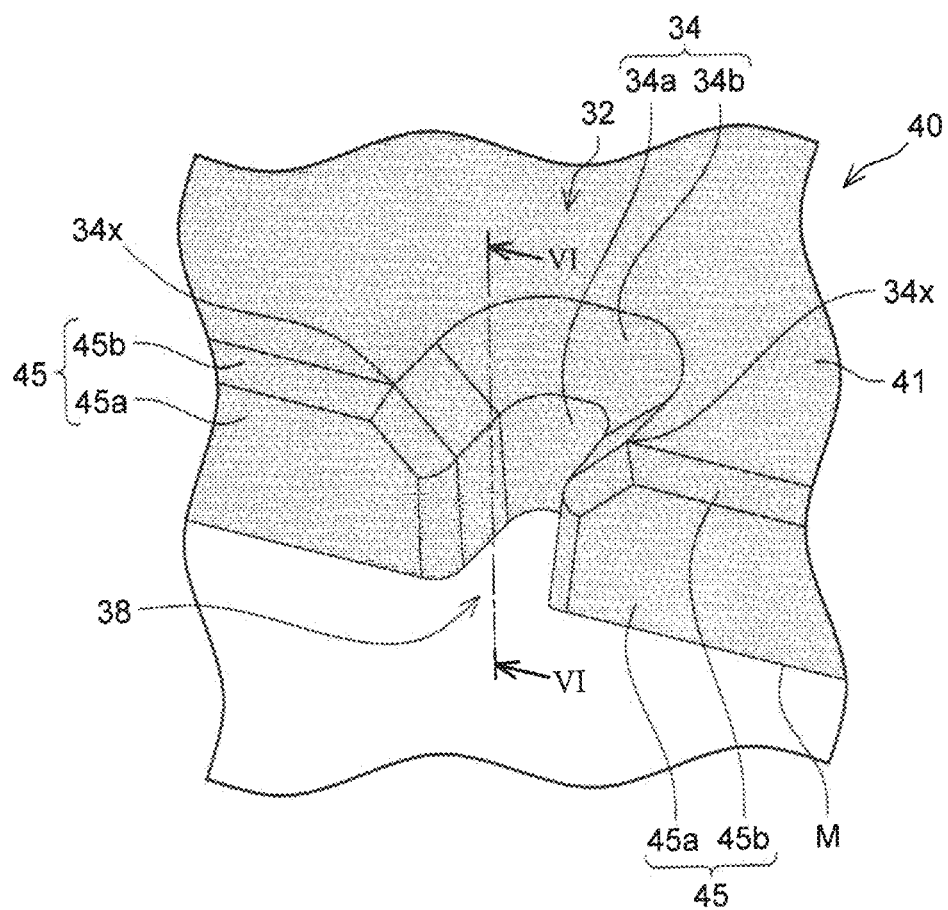
FIG. 5 is an enlarged perspective view of a groove.
Figure 6:
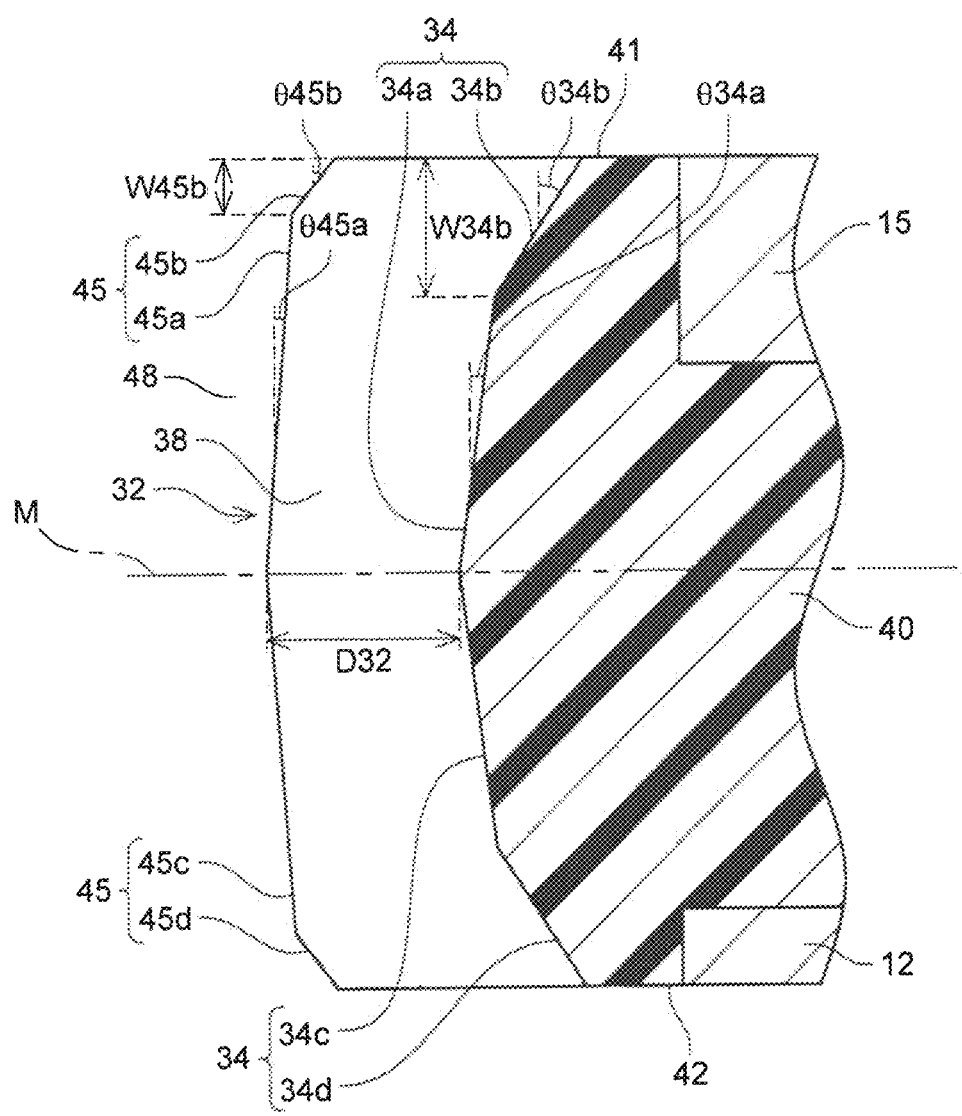
FIG. 6 is an enlarged cross sectional view of the groove.

FIG. 5 shows a perspective view of a part of the package resin 40, the part located on an upper surface 41 side with respect to an intermediate portion M in the thickness direction (a direction going from the lower surface 42 toward the upper surface 41) of the package resin 40, and the part also located around the groove 32. At a part of the package resin 40 located on a lower surface 42 side lower than the intermediate portion M, the groove 32 has the same shape as that in FIG. 5. FIG. 6 shows a cross sectional view of the package resin 40 taken along line VI-VI of FIG. 5 (i.e. a cross sectional view of an inner surface 34 of the groove 32). FIG. 6 shows an entire area in the thickness direction of the package resin 40. The inner surface 34 of the groove 32 has the same cross sectional shape as that in FIG. 6 at any portion thereof.

As shown in FIGS. 5, 6, the inner surface 34 of the groove 32 includes tapered surfaces 34a, 34b on the upper surface 41 side with respect to the intermediate portion M. The tapered surface 34a is adjacent to the intermediate portion M. The tapered surface 34b is disposed between the tapered surface 34a and the upper surface 41. The tapered surface 34b connects the tapered surface 34a to the upper surface 41. The tapered surface 34a inclines toward the upper surface 41. More specifically, the tapered surface 34a inclines in a manner as to be displaced in a direction from a space 38 inside the groove 32 toward the package resin 40 as the tapered surface 34a comes closer to the upper surface 41. The tapered surface 34b inclines toward the upper surface 41. More specifically, the tapered surface 34b inclines in a manner as to be displaced in a direction from the space 38 inside the groove 32 toward the package resin 40 as the tapered surface 34b comes closer to the upper surface 41. An inclination angle θ34b of the tapered surface 34b (i.e. an angle between the tapered surface 34b and the thickness direction of the package resin 40) is greater than an inclination angle θ34a of the tapered surface 34a (i.e. an angle between the tapered surface 34a and the thickness direction of the package resin 40). On the lower surface 42 side with respect to the intermediate portion M, the groove 32 has substantially the same shape as that of the part thereof located on the upper surface 41 side with respect to the intermediate portion M. That is, on the lower surface 42 side with respect to the intermediate portion M, the inner surface 34 of the groove 32 has tapered surfaces 34c, 34d. The tapered surface 34d is disposed between the tapered surface 34c and the lower surface 42. The tapered surfaces 34c, 34d incline toward the lower surface 42. The tapered surface 34d has a greater inclination angle than that of the tapered surface 34c.

As shown in FIGS. 5, 6, the side surface 45 includes tapered surfaces 45a, 45b on the upper surface 41 side with respect to the intermediate portion M. The tapered surface 45a is adjacent to the intermediate portion M. The tapered surface 45b is disposed between the tapered surface 45a and the upper surface 41. The tapered surface 45b connects the tapered surface 45a to the upper surface 41. The tapered surface 45a inclines toward the upper surface 41. More specifically, the tapered surface 45a inclines in a manner as to be displaced in a direction from a space 48 above the side surface 45 toward the package resin 40 as the tapered surface 45a comes closer to the upper surface 41. The tapered surface 45b includes toward the upper surface 41. More specifically, the tapered surface 45b inclines in a manner as to be displaced in a direction from the space 48 toward the package resin 40 as the tapered surface 45b comes closer to the upper surface 41. An inclination angle θ45b of the tapered surface 45b (i.e. an angle between the tapered surface 45b and the thickness direction of the package resin 40) is greater than an inclination angle θ45a of the tapered surface 45a (i.e. an angle between the tapered surface 45a and the thickness direction of the package resin 40). In the present embodiment, the inclination angle θ45b is substantially equal to the inclination angle θ34b, and the inclination angle θ45a is substantially equal to the inclination angle θ34a. In the thickness direction of the package resin 40, a width W45b of the tapered surface 45b is smaller than a width W34b of the tapered surface 34b. On the lower surface 42 side with respect to the intermediate portion M, the side surface 45 has substantially the same shape as that on the upper surface 41 side with respect to the intermediate portion M. This means that the side surface 45 includes tapered surfaces 45c, 45d on the lower surface 42 side with respect to the intermediate portion M. The tapered surface 45d is disposed between the tapered surface 45c and the lower surface 42. The tapered surfaces 45c, 45d incline toward the lower surface 42. The tapered surface 45d has a greater inclination angle than that of the tapered surface 45c. Although not illustrated, each of the side surfaces 43, 44, 46 has the same cross sectional shape (tapered shape) as that of the side surface 45.

If the inclination angles of the inner surface 34 (i.e. the tapered surface 34b) and the side surface 45 (i.e. the tapered surface 45b) of the groove 32 are greater in the vicinity of the upper surface 41, as aforementioned, it is possible to suppress chipping of the package resin 40 in the manufacturing process, as will be described later.

Figure 7:
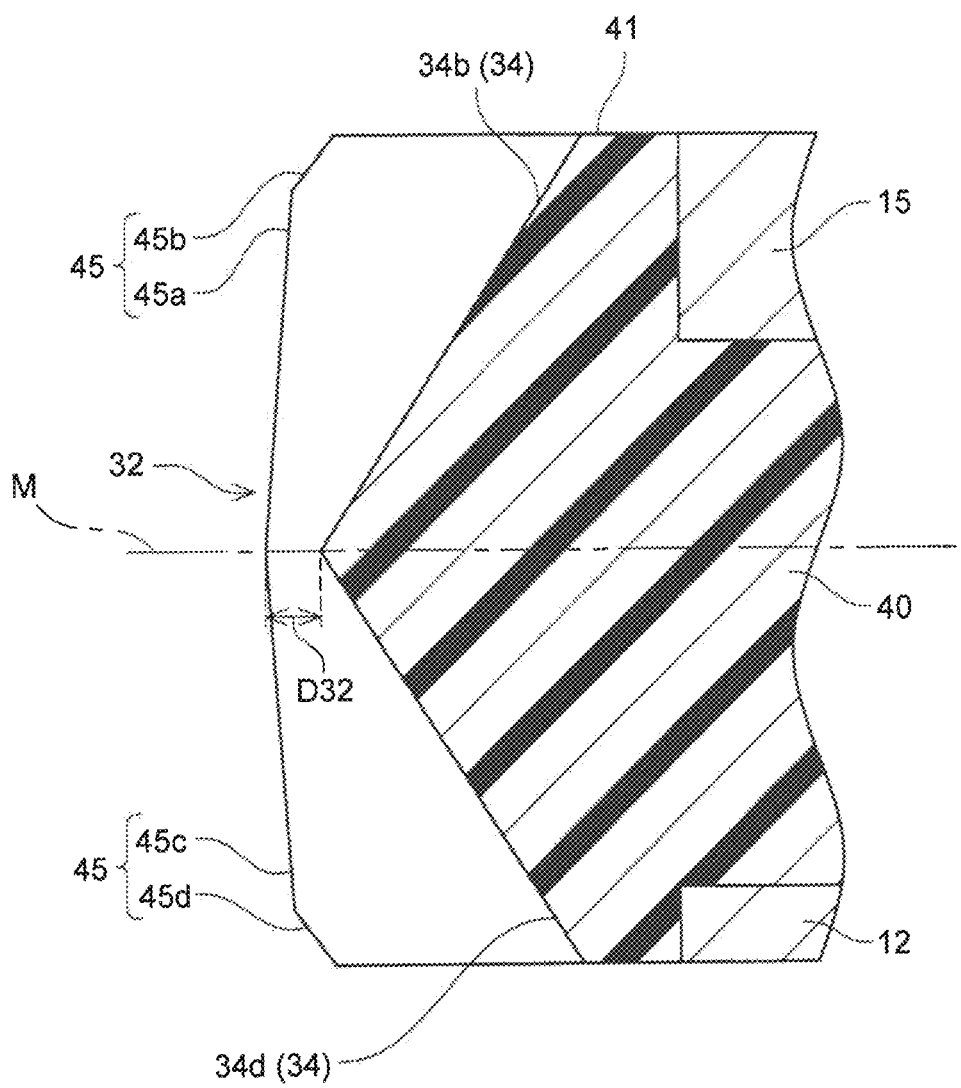
FIG. 7 is an enlarged cross sectional view of a groove configured by only tapered surfaces having greater inclination angles.

In order to set the inclination angle of the inner surface 34 of the groove 32 to be greater in the vicinity of the upper surface 41, the entire inner surface 34 of the groove 32 can be configured by only the tapered surfaces 34b, 34d having greater inclination angles, as shown in FIG. 7. However, in the configuration of FIG. 7, a depth D32 of the groove 32 in the intermediate portion M becomes extremely shallow. Hence, the surface distance between the signal terminals 81b and the terminal 14 is shorter, and thus the surface discharge is more likely to occur therebetween. On the other hand, as shown in FIG. 6, by providing the tapered surfaces 34a, 34c having smaller inclination angles in the inner surface of the groove 32, it is possible to set the depth D32 of the groove 32 in the intermediate portion M to be deeper. Hence, in the configuration of FIG. 6, the surface distance between the signal terminals 81b and the terminal 14 becomes longer, to thus effectively suppress the surface discharge therebetween.

In order to set the inclination angle of the side surface 45 to be greater in the vicinity of the upper surface 41, the entire side surface 45 can be configured by only the tapered surfaces 45b, 45d having greater inclination angles. However, this configuration causes increase in dimension of the semiconductor module. On the other hand, by providing the side surface 45 with the tapered surfaces 45a, 45c having smaller inclination angles as shown in FIG. 6, it is possible to avoid increase in dimension of the semiconductor module.

Figure 8:
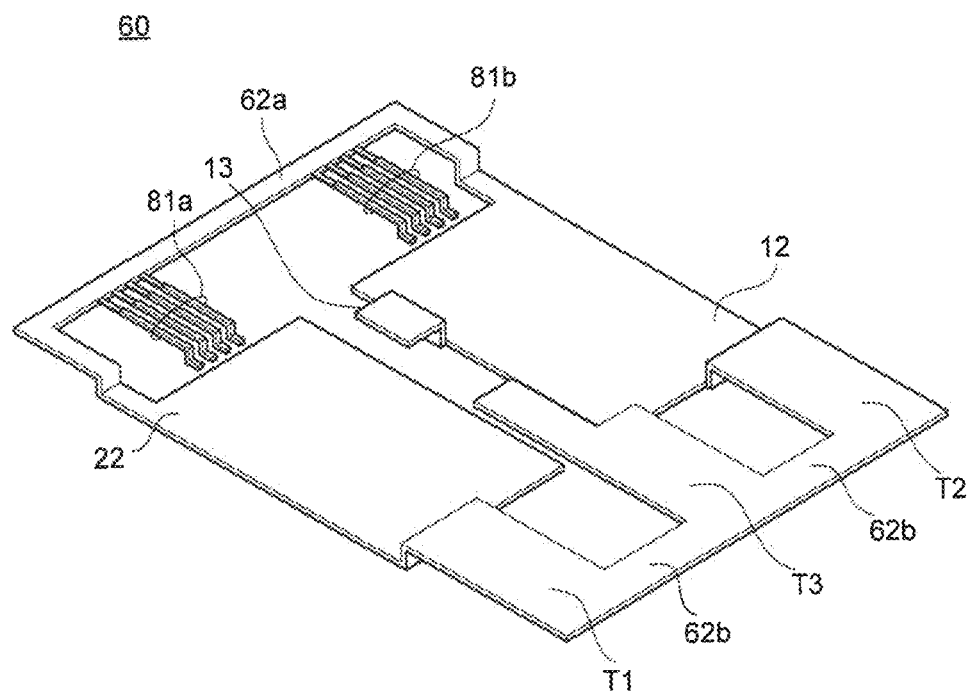
FIG. 8 is a perspective view of a lead frame.

The manufacturing method of the semiconductor module 2 will be described, hereinafter. First, a lead frame 60 shown in FIG. 8 is prepared. The lead frame 60 is a component configured by connecting the signal terminals 81a, 81b, the heat-dissipation plates 12, 22, and the terminals T1, T2, T3 to each other with tie bars 62a, 62b. The signal terminals 81a, 81b, the heat-dissipation plates 12, 22, and the terminals T1, T2, T3 are mutually fixed by the tie bars 62a, 62b.

Figure 9:
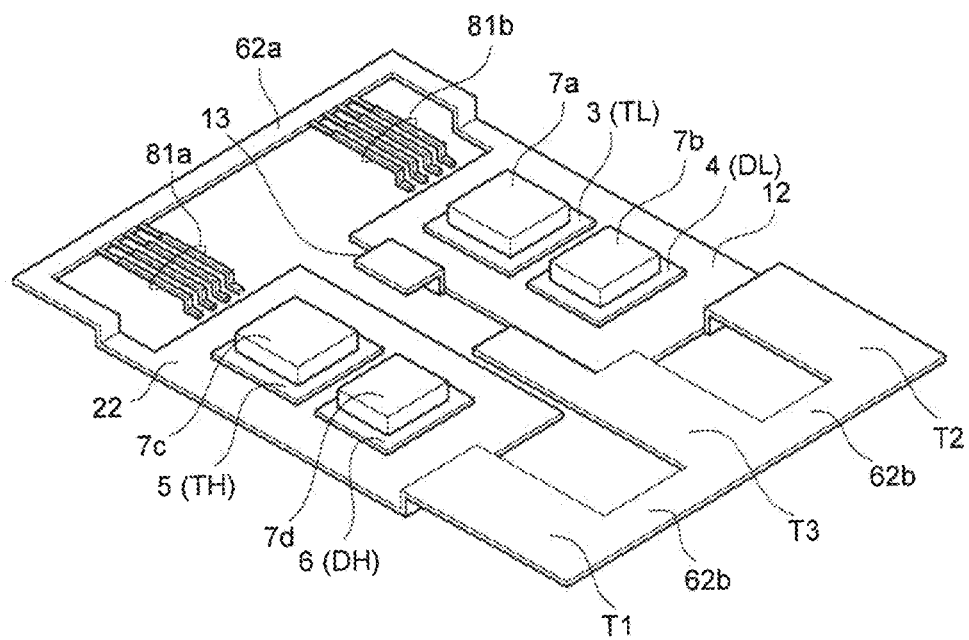
FIG. 9 is an explanatory view of an implementing process of a semiconductor chip.
Figure 10:
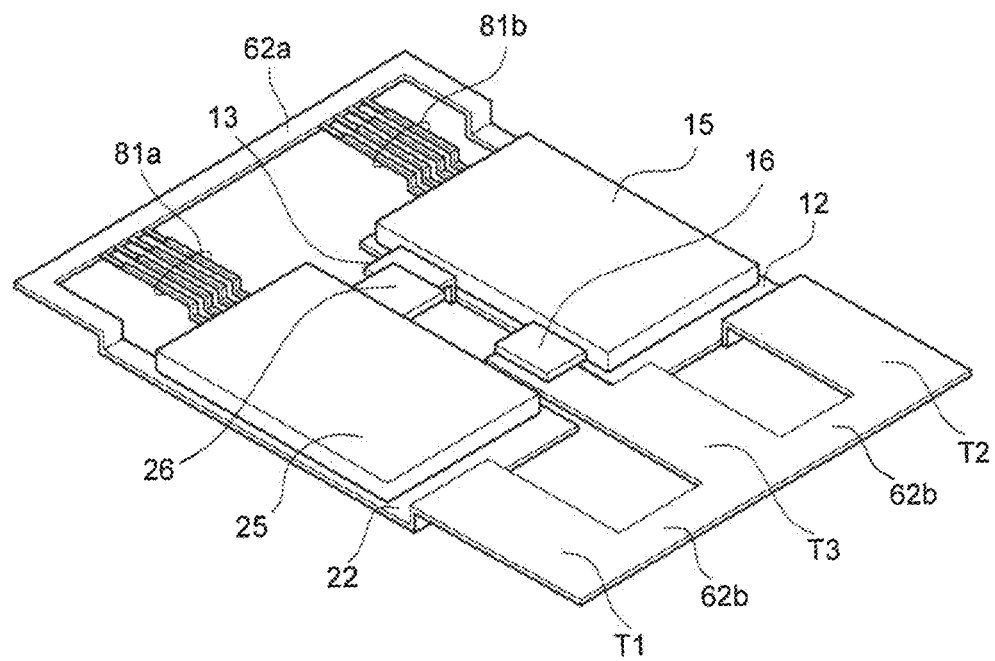
FIG. 10 is an explanatory view of a process of stacking heat-dissipation plates on the semiconductor chip.

Subsequently, as shown in FIG. 9, the semiconductor chips 3, 4, 5, 6 are stacked on the lead frame 60. A solder material is disposed between the lead frame 60 and the semiconductor chips 3, 4, 5, 6. The metallic blocks 7a, 7b, 7c, 7d are stacked on the semiconductor chips 3, 4, 5, 6. A solder material is disposed between the semiconductor chips 3, 4, 5, 6 and the metallic blocks 7a, 7b, 7c, 7d. As shown in FIG. 10, the heat-dissipation plates 15, 25 are stacked on the metallic blocks 7a, 7b, 7c, 7d. A solder material is disposed between the metallic blocks 7a, 7b, 7c, 7d and the heat-dissipation plates 15, 25. In this step, the joint portion 26 is disposed on the joint portion 13, and the joint portion 16 is disposed on the terminal T3. A solder material is disposed respectively between the joint portion 26 and the joint portion 13 and between the joint portion 16 and the terminal T3. Next, the stacked body shown in FIG. 10 is heated in a reflow oven, and thereafter is cooled. Through this, each solder material is once melted, and thereafter is solidified. Accordingly, the respective components shown in FIG. 10 are mutually fixed and electrically connected. Hereinafter, a structural body shown in FIG. 10 is referred to as an assembly 64.

Figure 11:
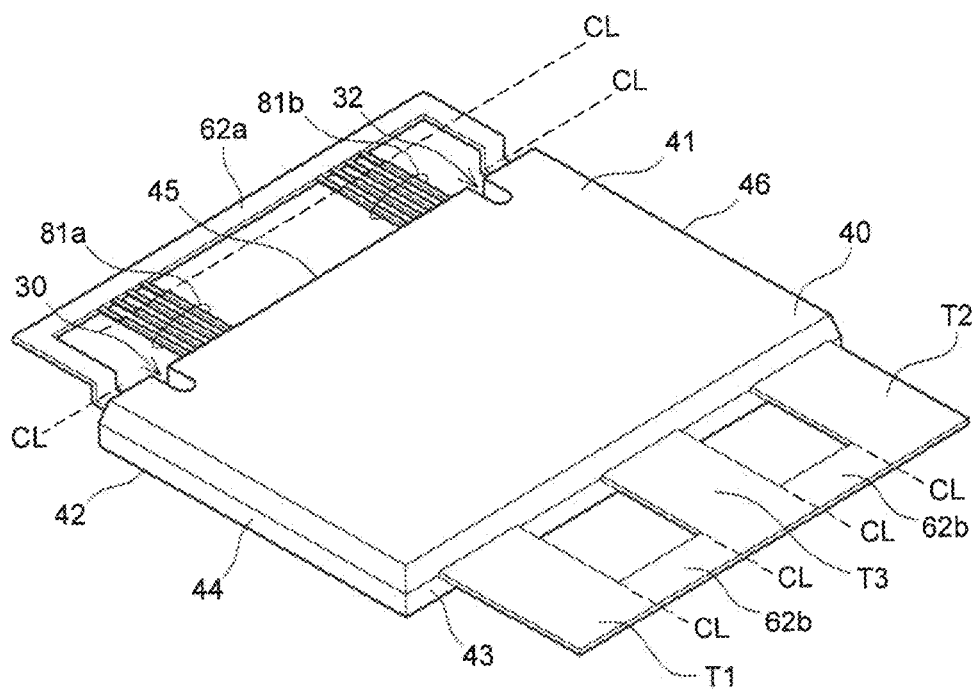
FIG. 11 is an explanatory view of an injection molding.
Figure 12:
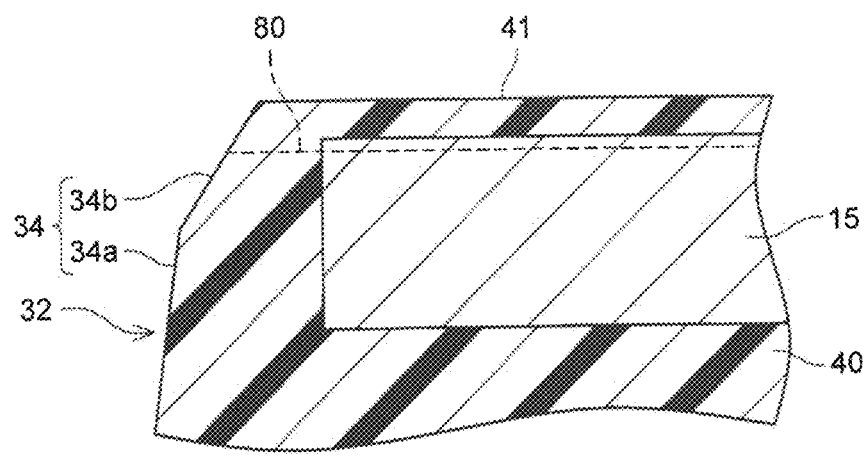
FIG. 12 is an explanatory view of a cutting process.

Subsequently, as shown in FIG. 11, the assembly 64 is sealed with the package resin 40 through injection molding. The package resin 40 is formed such that front end portions of the signal terminals 81a, 81b, front end portions of the terminals T1, T2, T3, the tie bars 62a, 62b, and the lower surfaces of the heat-dissipation plates 15, 25 are exposed from the package resin 40, and the other portions of the assembly 64 are covered by the package resin 40. Specifically, in this step, the upper surfaces of the heat-dissipation plates 15, 25 are covered by the package resin 40. Hence, the heat-dissipation plates 15, 25 are not exposed on the upper surface 41 of the package resin 40. In this step, as shown in FIG. 12, 13, the tapered surface 34b of the groove 32 and the tapered surface 45b of the side surface 45 extend to the upper surface 41 of the package resin 40.

Figure 13:
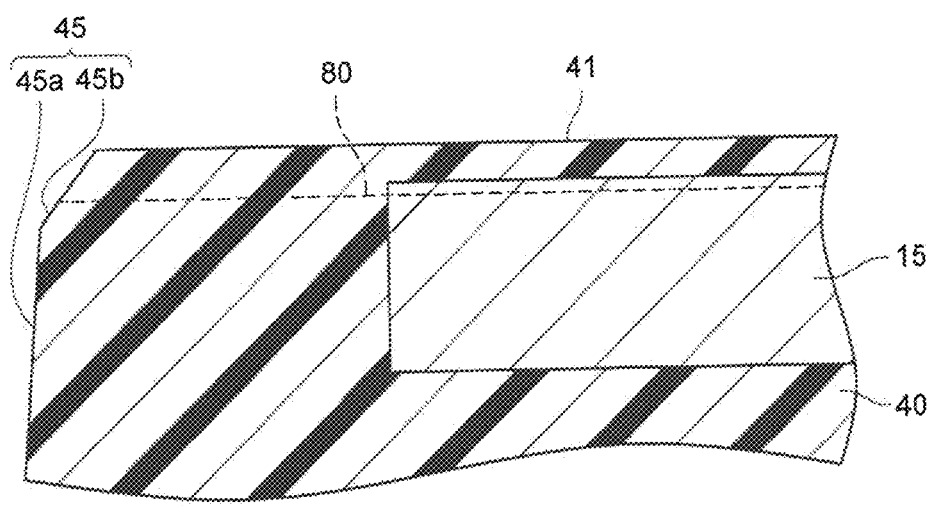
FIG. 13 is an explanatory view of the cutting process.
Figure 14A:
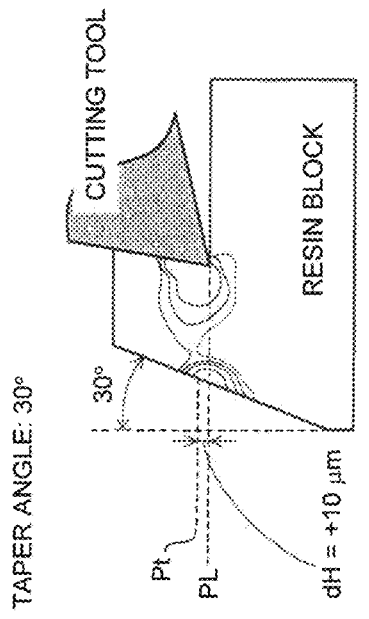
FIG. 14A is a simulation result showing a strain caused in a tapered surface during cutting at a taper angle of 5°.
Figure 14B:
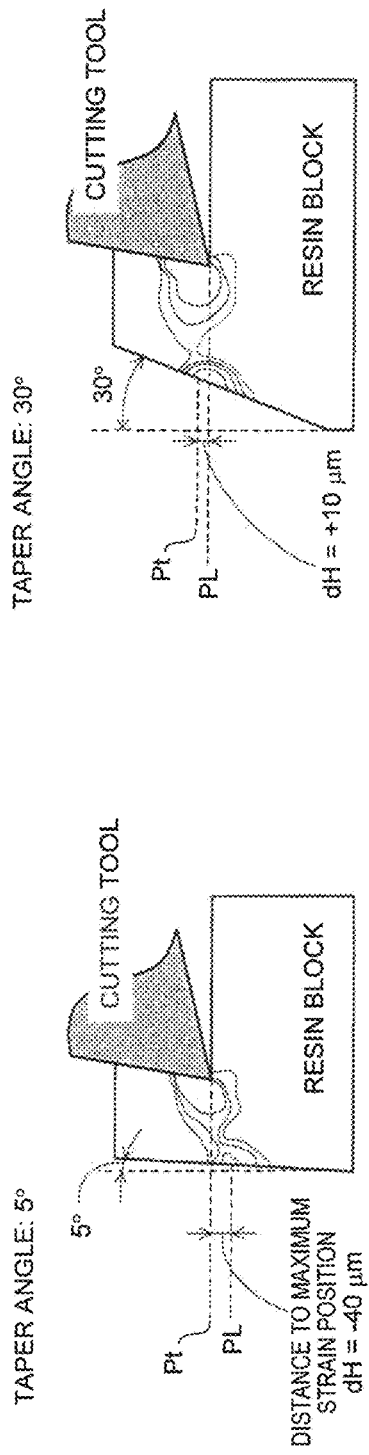
FIG. 14B is a simulation result showing a strain caused in a tapered surface during the cutting at a taper angle of 30°.
Figure 14C:
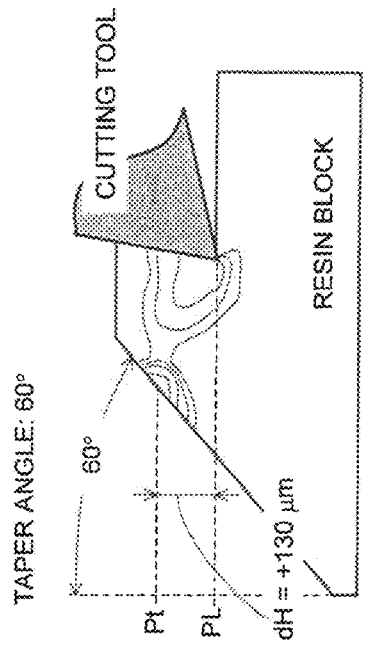
FIG. 14C is a simulation result showing a strain caused in a tapered surface during the cutting at a taper angle of 45°.
Figure 14D:
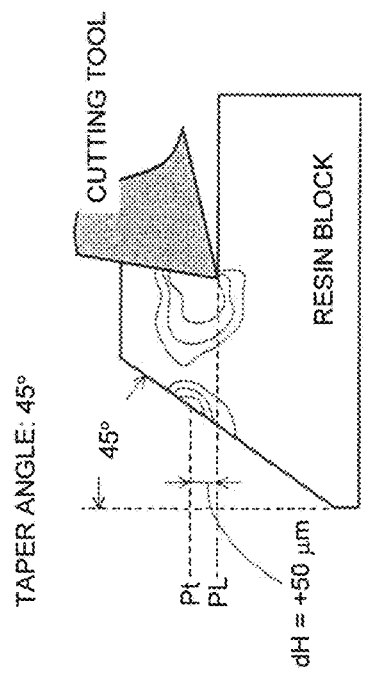
FIG. 14D is a simulation result showing a strain caused in a tapered surface during the cutting at a taper angle of 60°.

Next, the entire area of the upper surface 41 of the package resin 40 is cut by a cutting tool. Here, a portion above a broken line 80 shown in FIGS. 12, 13 (i.e. respective portions of the package resin 40 and the heat-dissipation plates 15, 25 that are located above the broken line 80) is cut. The broken line 80 (i.e. a lower end of the area to be removed by cutting) is located on the upper surface 41 side with respect to a boundary between the tapered surface 34a and the tapered surface 34b and with respect to a boundary between the tapered surface 45a and the tapered surface 45b. The broken line 80 reaches the side surface 45 and the inner surface 34 of the groove 32. That is, an edge of the cutting tool passes through the side surface 45 and the inner surface 34 of the groove 32. When the edge of the cutting tool cuts the package resin 40 in the side surface 45 and the inner surface 34, the surface of the package resin 40 might be chipped. Such chipping of the package resin 40 is likely to occur in a corner at the boundary between the side surface 45 and the upper surface 41 and in a corner at the boundary between the inner surface 34 and the upper surface 41. In particular, the chipping is more likely to occur at boundary spots among three of the inner surface 34, the side surface 45, and the upper surface 41 (each portion corresponding to an apex 34x in FIG. 5). However, if the inclination angles of the inner surface 34 and the side surface 45 at a position where the edge of the cutting tool passes (i.e. the position indicated by the broken line 80) are great, occurrence of the chipping of the package resin 40 is suppressed. In addition, if the inclination angles of the inner surface 34 and the side surface 45 located at the position where the edge of the cutting tool passes are greater, the size of the chipping to be caused becomes smaller. According to experiments, if the inclination angle of the side surface at the position where the edge of the cutting tool passes was 5°, the size of chipping was approximately 1.0 to 2.2 mm, whereas if the above inclination angle was 30°, the size of chipping was approximately 0.1 to 0.4 mm. In the present embodiment, the tapered surface 34b having a greater inclination angle θ34b is provided in the inner surface 34 located at the position of the broken line 80. In addition, the tapered surface 45b having a greater inclination angle θ45b is provided in the side surface 45 located at the position of the broken line 80. Hence, when the package resin 40 is cut at the position of the inner surface 34 and the side surface 45, chipping is hard to occur in the package resin 40, and even though chipping occurs, the size of the chipping becomes smaller. Accordingly, a defect due to the chipping of the package resin 40 is hard to occur during the cutting. By performing the cutting in the above manner, the upper surfaces of the heat-dissipation plates 15, 25 are exposed on the upper surface 41 of the package resin 40, as shown in FIG. 1.

Next, the tie bars 62a, 62b are cut along cut lines CL in FIG. 11. By cutting the tie bar 62b, the terminals T1, T2, T3 are separated from each other. By cutting the tie bar 62a, the signal terminals 81a, 81b are separated from each other. A portion of the tie bar 62a located near the package resin 40 remains to become the terminals 14, 24 in FIG. 1. By cutting the tie bars 62a, 62b, the semiconductor module 2 shown in FIG. 1 is completed.

The present inventors have conducted simulation and studies on taper angles and easiness of chipping occurrence in tapered surfaces. Results thereof will be described, herein. The present inventors have simulated distributions of strain caused in each resin block when a surface of the resin block is cut toward a tapered surface thereof, using various taper angles. The results thereof are shown in FIG. 14A to FIG. 14D. In the simulation, the same physical properties as those of the package resin 40 in the embodiment example were applied to each resin block.

In FIG. 14A to FIG. 14D, a group of curved lines appearing in each resin block indicates equal-strain contour lines. A more inward curved line in each tapered surface indicates a greater strain. A broken line PL indicates a position of a cut surface. A broken line Pt indicates a position of the tapered surface (a straight line at a leftmost end of each test block) having a greatest strain (a maximum strain position). It is understood that as the taper angle becomes greater, the maximum strain position in the tapered surface shifts more upward in the drawing. A portion of each tapered surface having a greater strain is more likely to be chipped. In other words, because of having a greater strain, chipping might be caused in the tapered surface.

A reference numeral dH in each of FIG. 14A to FIG. 14D indicates a distance from the cut surface to a maximum strain position (a distance in a height direction). The distance dH is defined to be a positive value if the maximum strain position is located above the cut surface, while defined to be a negative value if the maximum strain position is below the cut surface. If the distance dH is a positive value, the position where the strain becomes maximum is removed when the cutting tool reaches the tapered surface. If the distance dH is a negative value, the position where the strain becomes maximum remains after the cutting. That is, if the distance dH is a negative value, the position where the strain becomes maximum is left in the resin block after the cutting; consequently, if chipping occurs in the tapered surface due to a great strain, the tapered surface with the chipping is left in the resin block.

Figure 15:
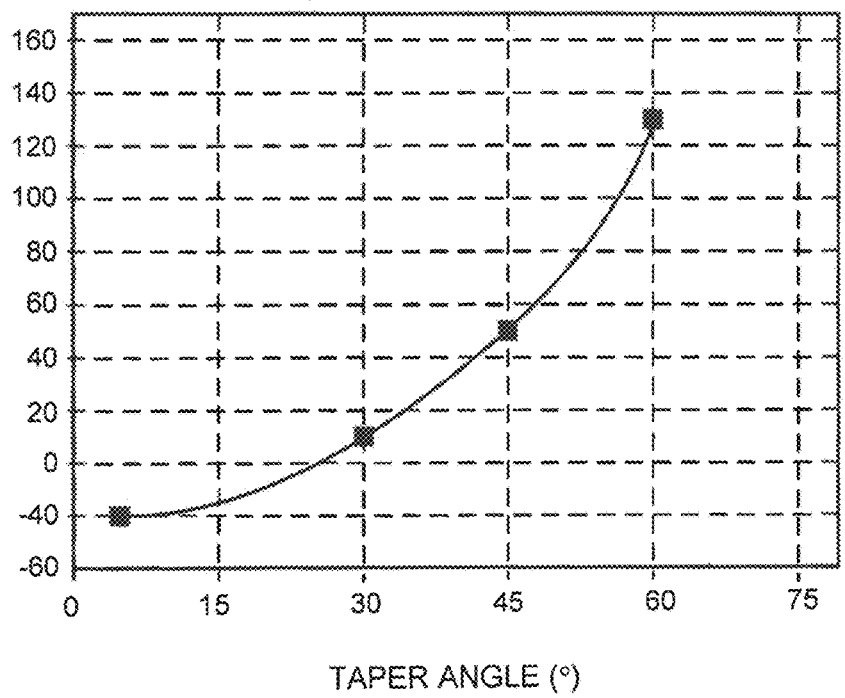
FIG. 15 is a graph showing simulation results.
Figure 16:
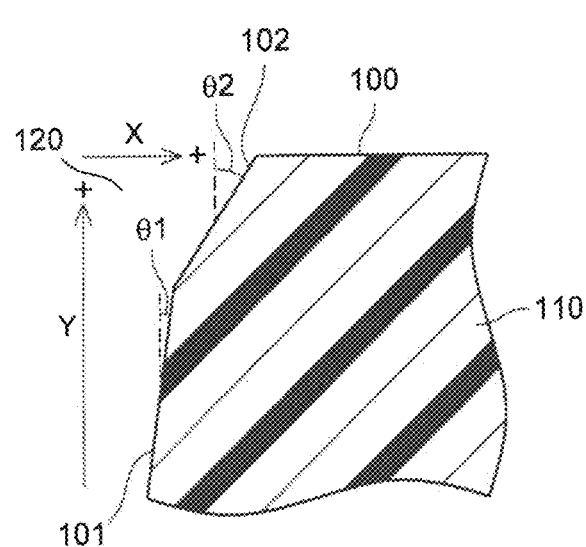
FIG. 16 is an explanatory view of a direction of an inclination and an inclination angle.

FIG. 15 is a graph of the results of FIG. 14A to FIG. 14D. As the taper angle becomes greater, the distance dH also becomes greater. In other words, as the taper angle becomes greater, the position where the strain becomes maximum in the tapered surface shifts more upward. The position where the strain becomes maximum changes from a negative value to a positive value around the taper angle of approximately 30°. Hence, it is preferable to set the taper angle to be 30° or more.

As aforementioned, according to this manufacturing method, a defect due to the chipping of the package resin 40 is hard to occur during the cutting. Accordingly, it is possible to manufacture the semiconductor module 2 at a high yield rate. Through the aforementioned cutting process, the upper surface 41 of the package resin 40, the upper surface of the heat-dissipation plate 15, and the upper surface of the heat-dissipation plate 25 are formed into a smooth flat surface. According to this method, it is possible to manufacture the semiconductor module 2 with a high dimensional accuracy.

A relation between configuration elements of the present embodiment and configuration elements of the claims will be described as below. The upper surface 41 of the present embodiment corresponds to one example of a first surface of the claims. The lower surface 42 of the present embodiment corresponds to one example of a second surface of the claims. The side surface 45 of the present embodiment corresponds to one example of a side surface of the claims. The terminals 14, 24, 81a, 81b of the present embodiment correspond to one example of multiple terminals of the claims. The tapered surface 34a of the present embodiment corresponds to one example of a first tapered surface of the claims. The tapered surface 34b of the present embodiment corresponds to one example of a second tapered surface of the claims. The tapered surface 45a of the present embodiment corresponds to one example of a third tapered surface of the claims. The tapered surface 45b of the present embodiment corresponds to one example of a fourth tapered surface of the claims.

Technical elements disclosed in the present specification will be described as below. The following respective technical elements are independently useful.

One example of the configuration disclosed in the present specification includes: the third tapered surface that is the side surface of the resin inclining toward the first surface; and the fourth tapered surface that is provided between the third tapered surface and the first surface and that inclines toward the first surface at a greater inclination angle than that of the third tapered surface. In the cutting process, the first surface is cut within an area located on the first surface side from the boundary between the third tapered surface and the fourth tapered surface.

According to this configuration, during the cutting, it is possible to suppress occurrence of chipping in the side surface of the resin. The side surface can be formed into a two-stepped tapered surface, to thereby prevent increasing in dimension of the semiconductor module.

As aforementioned, the embodiments have been described in detail; however, these are only examples and do not limit the present disclosure. The technology described in the present disclosure includes various modifications and changes of the concrete examples represented above within the scope of the spirit of the present disclosure. The technical elements explained in the present description or drawings exert technical utility independently or in various combinations of them. Moreover, the technology exemplified in the present description or drawings achieves a plurality of objects at the same time, and has technical utility by achieving one of such objects.

What is claimed is:

1. A manufacturing method of a semiconductor module comprising:
   (a) sealing an assembly with resin, the assembly including a semiconductor chip, a heat-dissipation plate connected to the semiconductor chip, and multiple terminals connected to the semiconductor chip, such that
      the resin after the assembly is sealed includes a first surface, a second surface located opposite to the first surface, and a side surface connecting the first surface to the second surface,
      the multiple terminals projects from the side surface,
      a groove is provided between the multiple terminals in the side surface in a manner as to extend from the first surface to the second surface,
      an inner surface of the groove includes a first tapered surface inclining toward the first surface, and a second tapered surface provided between the first tapered surface and the first surface, the second tapered surface inclining toward the first surface at a greater inclination angle than an inclination angle of the first tapered surface; and
   (b) cutting the first surface within an area located on a first surface side from a boundary between the first tapered surface and the second tapered surface such that the heat-dissipation plate exposes on the first surface.

2. The manufacturing method of the semiconductor module according to claim 1, wherein
   the side surface includes:
      a third tapered surface inclining toward the first surface; and
      a fourth tapered surface provided between the third tapered surface and the first surface, the fourth tapered surface inclining toward the first surface at a greater inclination angle than an inclination angle of the third tapered surface, and
   in the step of (b), the first surface is cut within an area located on the first surface side from a boundary between the third tapered surface and the fourth tapered surface.

3. The manufacturing method of the semiconductor module according to claim 2, wherein
   the third tapered surface and the fourth tapered surface are provided in portion of the side surface including outside of the groove.

4. A semiconductor module comprising:
   an assembly including a semiconductor chip, a heat-dissipation plate disposed on a surface of the semiconductor chip, and multiple terminals connected to the semiconductor chip, and
   resin provided such that the resign seals the assembly, the resin including a first surface in contact with the heat-dissipation plate, a second surface located opposite to the first surface, and side surfaces connecting the first surface to the second surface, wherein
   the multiple terminals project from the side surface,
   a groove is provided between the multiple terminals in the side surface such that the groove extends from the first surface to the second surface,
   an inner surface of the groove includes a first tapered surface inclining toward the first surface, and a second tapered surface provided between the first tapered surface and the first surface, the second tapered surface inclining toward the first surface at a greater inclination angle than an inclination angle of the first tapered surface, and
   the resin has an opening at which the heat-dissipation plate is exposed on the first surface, the opening being provided from an area located on a first surface side from a boundary between the first tapered surface and the second tapered surface across the first surface.

5. The semiconductor module according to claim 4, wherein
   the side surface includes a third tapered surface inclining toward the first surface, and a fourth tapered surface provided between the third tapered surface and the first surface, the fourth tapered surface inclining toward the first surface at a greater inclination angle than an inclination angle of the third tapered surface, and
   the opening is provided within an area located on the first surface side from a boundary between the third tapered surface and the fourth tapered surface.

6. The semiconductor module according to claim 5, wherein
   the third tapered surface and the fourth tapered surface are provided in portions of the side surface including outside of the groove.

* * * * *